United States Patent [19]
Coneski et al.

[11] Patent Number: 5,233,895
[45] Date of Patent: Aug. 10, 1993

[54] MAGNETIC PLATE PUNCH ACTUATOR

[75] Inventors: Anthony F. Coneski, Newburgh; Mitchel Waian, Wappingers Falls, both of N.Y.

[73] Assignee: International Business Machines Corp., Armonk, N.Y.

[21] Appl. No.: 974,641

[22] Filed: Nov. 12, 1992

[51] Int. Cl.[5] .............................................. B26D 5/08
[52] U.S. Cl. ......................................... 83/575; 83/146; 234/107
[58] Field of Search ................. 83/575, 576, 577, 146, 83/76.1, 620; 234/107, 108; 72/430, 707

[56] References Cited

U.S. PATENT DOCUMENTS

| | | |
|---|---|---|
| 1,138,804 | 5/1915 | Simmen . |
| 2,509,956 | 5/1950 | Benoit . |
| 2,597,559 | 5/1952 | Bekey .................................. 175/335 |
| 2,730,103 | 1/1956 | Mackta ................................ 128/305 |
| 3,486,400 | 12/1969 | Westmijze et al. ................... 77/32.9 |
| 3,709,083 | 1/1973 | Doherty ................................ 83/575 |
| 3,841,185 | 10/1974 | Baran .................................... 83/364 |
| 3,878,412 | 4/1975 | Kurpanek ............................. 310/24 |
| 4,821,614 | 4/1989 | Fleet et al. ............................ 83/100 |
| 4,872,381 | 10/1989 | Stroms ................................. 83/76.1 |
| 5,024,127 | 6/1991 | Mueller et al. ........................ 83/13 |
| 5,079,983 | 1/1992 | Bruhn .................................... 83/575 |
| 5,090,284 | 2/1992 | Nakajima .............................. 83/577 |
| 5,113,736 | 5/1992 | Meyerle ................................ 83/575 |

FOREIGN PATENT DOCUMENTS 600578 2/1926 France .
705398 6/1931 France .

OTHER PUBLICATIONS

Automated Punch Apparatus for Forming Via Holes In A Ceramic Green Sheet, T. J. Cochran et al, IBM Tech. Discl. Bull. vol. 20, No. 4, pp. 1379–1380, Sep. 1977.
Punch Programmer With Magnet Retract, A. F. Coneski et al., IBM Tech. Discl. Bull., vol. 26, No. 7A, pp. 3173–3175, Dec. 1983.

Primary Examiner—Eugenia Jones
Attorney, Agent, or Firm—Laurence R. Letson

[57] ABSTRACT

A punch station for punching ceramic green sheets comprises a magnet plate and two flux guide plates to form the flux field within which a coil of wire resides and acts to cause the punching movement of a punch. The magnet plate allows the placement of adjacent punch stations more closely together than is possible when cylindrical magnets are used since the magnetic material lying between the punch being activated and the punches surrounding the activated punch has an additive effect and produces a more dense flux field than achievable with the cylindrical magnets. The flux guide plates concentrate the flux from the magnet plate into a small gap further increasing flux density in the working gap. The magnet plate overcomes the losses inherent with magnets separated by air gaps.

7 Claims, 1 Drawing Sheet

MAGNETIC PLATE PUNCH ACTUATOR

FIELD OF THE INVENTION

This invention relates to punching holes into ceramic green sheets (unfired ceramic sheets) and, more particularly, to the punch mechanism for punching the holes through a green sheet.

BACKGROUND OF THE INVENTION

The manufacture of electronic circuits for use in computers and similar devices includes deposits of electronic circuit lines, elements and traces onto ceramic sheets. The ceramic sheet is the substrate for the circuits and provides insulation between adjacent electrical paths, while at the same time provides a rigid support. A multi-layer structure of ceramic, each layer having electronic circuits formed and deposited on the layer, permits an inherently more compact and efficient structure. In the manufacture of these electronic devices, after the unfired ceramic substrate is formed, small holes are punched which extend from one face of the ceramic layer through the sheet to a second face of the ceramic layer. These holes are commonly known as via holes, and they permit the formation of electrically conductive paths from one face of the device to the second face which provide connections with electronic circuits on the second face or for connection to electronic circuits on an adjacent ceramic layer. In addition, the via hole may provide an electronic connection or path to another via hole on the next adjacent layer extending therethrough to connect to yet another layer in the multi-layer structure. In a multi-layer ceramic structure via holes are required to be very precisely positioned since they must match either with via holes in the next adjacent layer or must match with the precise location of an electrical contact on the next adjacent ceramic layer.

The formation of the holes in the ceramic material is accomplished in its green state. The green state of the ceramic layers exists prior to the sheets being fired and ceramic particles being fused. Prior to being fired, the green sheets are easily deformed therefore, the precision with which the via holes are formed into the green sheets is greatly dependent upon the use of apparatuses which minimizes distortion or disruption to the structural integrity of the green sheet, other than forming the via hole.

With the size of electrical components constantly being reduced, through technical improvement, the positioning of the via holes in ceramic green sheets is becoming ever more restrictive. Further, with the increase in the quantity of electronic circuits that may be positioned and packaged on a small area of a ceramic substrate, the requirement for a larger number of via holes is evident.

Large numbers of holes must be punched into a green sheet with a high degree of precision in order to properly position the holes; and at the same time, this punching operation must occur very rapidly in order to produce the large numbers of green sheets that are necessary in the mass production of electronic chip carriers. The fabrication of dedicated punches for certain fixed patterns of via holes is not practical because the same apparatus may be used to form different via hole patterns in ceramic green sheets being used for a large number of diverse electronic applications.

With the requirement for high speed and versatility of the hole positions, it becomes necessary to package a large number of punching devices into a relatively small area in order to maximize manufacturing throughput. Electrically controlled punches for punching holes in green sheets have been previously developed but the punches have some inherent disadvantages which are overcome by the present invention. The prior effort to create an electrically controlled punching mechanism to punch via holes into ceramic green sheets is reflected in U.S. Pat. No. 5,024,127, to Mueller et. al. Mueller shows an individual punch mechanism which utilizes a cylindrical magnet which extends over approximately half of the length of the punch mechanism. The magnet cylinder provides the magnetic field against which the voice coil operates, and the interaction of the magnetic fields between the cylindrical magnet and the voice coil acts to move the punch element. Punches of this general type have relatively weak magnetic fields and thus require a substantial electrical current to be passed through the voice coil in order to displace the punch and the punch cap. Further, the device of Mueller relies upon reversal of the magnetic forces generated by the voice coil to extract the punch from the green sheet. The relatively high level of electrical current, combined with the extended duty cycle of the voice coil, when used to retract the punch, results in substantial heat loads which must be dissipated to insure that the punch continues to operate properly.

While solenoids may be implemented in this type of punch, in order to generate sufficient forces and velocity for punching, the mass of the armature of the solenoid is so large that accelerations of sufficient magnitude to rapidly punch the ceramic green sheet with a minimum of distortion to the ceramic green sheet cannot be satisfactorily accomplished.

Since the punching power of solenoid actuated punches of this type and purpose generate relatively low levels of power in comparison to their size and electrical power requirements, and since it is desirable also to place as many punches as closely as possible in order to be able to accurately position via holes in ceramic green sheets, it is necessary to consider alternate designs for the propelling mechanism of the punch.

SUMMARY OF THE INVENTION

It is an object of the invention to provide a relatively high level of punch power with a relatively low level of electrical requirement and a minimal cooling requirement.

It is another object of the invention to package a large number of punches in a small structure in order to enhance via hole location control and the speed with which the punching action occurs.

It is a further object of the invention to minimize the distortion to the ceramic green sheet which results from relatively slow punch velocities.

The foregoing objects of the invention are accomplished and the shortcomings of the prior art overcome by the formation of a magnet plate which contains a series of cylindrical holes into which portions of the punch mechanism may be inserted. These cylindrical holes may be relatively spaced to close each other in order to provide a high density punching device while at the same time maintaining adequate magnetic field strength for the proper operation and for generating the high velocity of the punch. The magnetic field generated by the magnet plate is concentrated to provide a high flux density by the use of flux guide plates which are placed on either side of and sandwich the magnet plate. The flux guide plates focus the magnetic field into regions which are most effective for cooperation with the drive mechanism of the punch assembly.

The precise positioning of the punch relative to the ceramic green sheets is controlled by a bushing plate which supports and constrains elements of the punch drive mechanism. The bushing plate contains guide bushings and stripper bushings to insure that the position of the punch remains fixed in the plane of the ceramic green sheet and which insures that the ceramic green sheet is not deformed undesirably by the withdrawal of the punch from the ceramic green sheet.

DETAILED DESCRIPTION OF THE INVENTION

Figure 2:
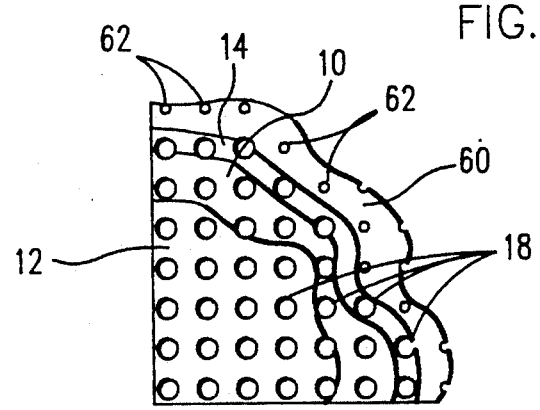
FIG. 2 illustrates a top view of the upper flux guide and magnet plate.

With reference now to the drawings, a magnetic plate 10 is provided in the form illustrated in FIG. 2. The magnetic plate 10 is positioned in face-to-face relationship with an upper flux guide plate 12 which is typically a soft magnetically permeable steel plate member. The magnetic plate 10 may be fabricated out of neodymium iron or any other rare earth type magnetic material and may be formed by pressing and/or sintering if desired. Below plate 10 in FIG. 2 is a lower flux guide plate 14 fully analogous to the upper flux guide plate 12. The two flux guide plates 12, 14 act to contain and direct the magnetic field from magnet plate 10 into a gap which is formed when pole piece 16 is inserted within the cylindrical hole 18. Pole piece 16 preferably is fashioned from a soft iron material and merely acts as a conductor of the magnetic field from the lower flux guide plate 14 to the vicinity of the upper flux guide plate 12. The pole piece 16 typically is dimensioned to be positioned within lower flux guide plate 14 with a force fit to provide not only stability, but also to provide a lower resistance magnetic path between lower flux guide plate 14 and pole piece 16. Elimination of an air gap between lower flux guide plate 14 and pole piece 16 is important. At the region of upper flux guide plate 12, the diameter of the pole piece 16 is reduced to form a gap 20 between the respective elements 12, 16. The gap 20 is dimensioned so that it is as small as possible to provide for efficient concentration of the magnetic field strength in this region and small losses of flux density in the gap 20.

The interior of pole piece 16 is provided with a cylindrical bore 22 to permit the insertion of punch tube 78 and punch 24. The pole piece 16 further is provided with an enlarged bore 26 at each end into which bushings 28 may be inserted to guide and constrain punch tube 78 and punch 24 from unwanted lateral movements within bore 22. Punch 24 is provided with a head 30 which may be trapped and constrained by a movable bobbin 32. Movable bobbin 32 is a cap-like structure which is provided with a central bore 34 through which punch tube 78 and punch 24 may pass.

Punch tube 78 is attached to and moves with bobbin 32. Punch 24 resides within punch tube 78. The function of punch tube 78 is to locate bobbin 32 on the axis of pole piece 16 and to guide bobbin 32 when bobbin 32 moves to punch or retract.

The bobbin 32 is provided with a chamber 36 into which the head 30 of punch 24 may be positioned and trapped. The trapping function for containing head 30 within chamber 36 is provided by a retainer 38 which may be attached to the bobbin 32 by means of a screw 40 or other suitable fastening means. The retainer, commonly referred to as a one-quarter turn retainer 38 is a piece of sheet material pivoted about screw 40, such that it may be pivoted over punch head 30, and the end of retainer 38 may be engaged by a notch 42 formed into the bobbin 32. This arrangement is exceedingly beneficial in the rapid and efficient changing of punches 24, which become worn or broken through usage.

Bobbin 32 is supported by a spring, preferably a leaf spring 44, which is grounded to a frame 46. The leaf spring 44 will act to withdraw bobbin 32 from a displaced position against the upper flux guide plate 12. The leaf spring 44 will offer relatively small resistance to movement of bobbin 32, punch tube 78 and punch 24.

Figure 1:
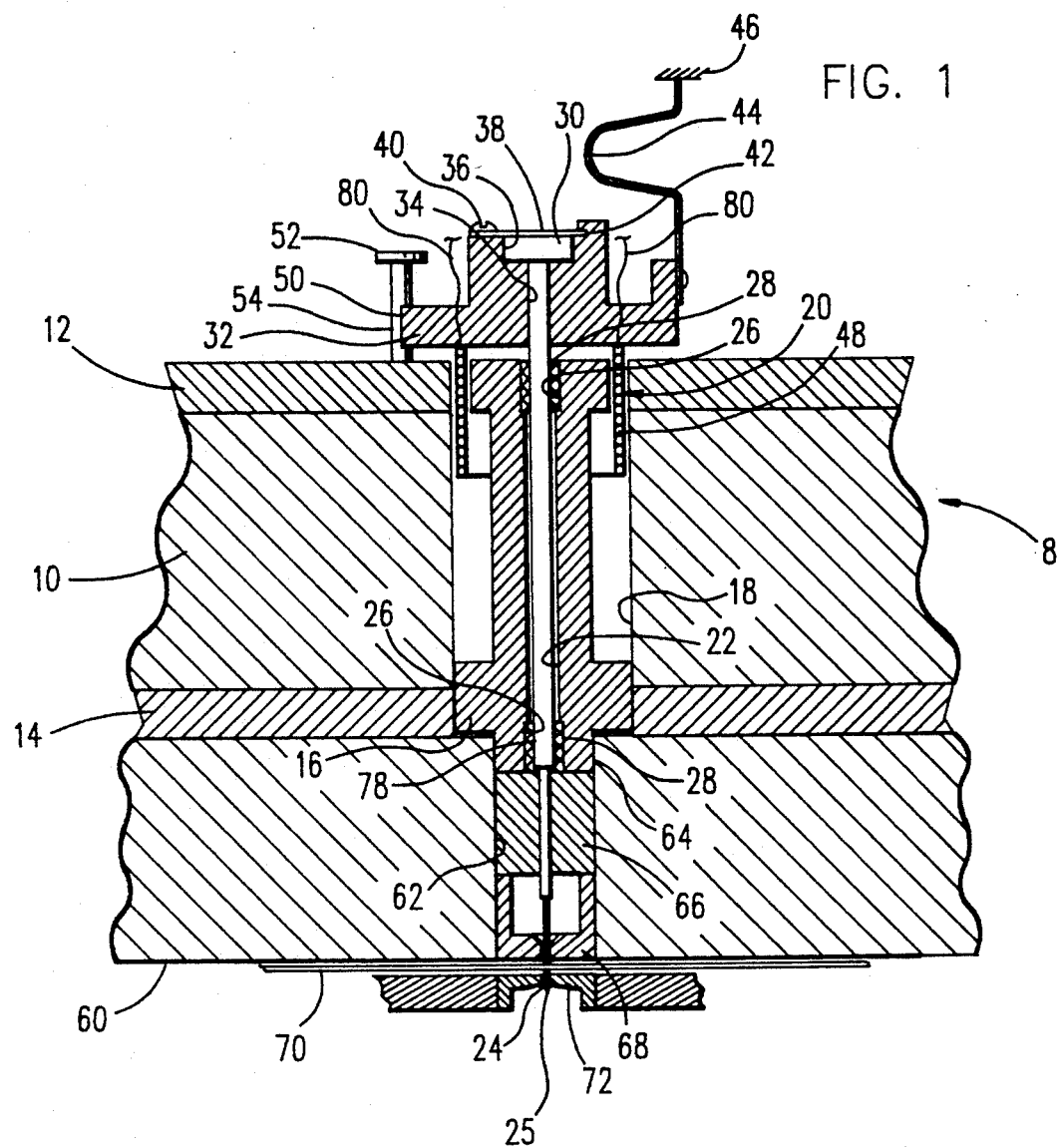
FIG. 1 shows a sectional view of the one of the punch stations of the present invention.

As illustrated in FIG. 1, the moving force to pull bobbin 32 generally downward and thereby displacing punch 24 is provided by a voice coil 48. Voice coil 48 may typically be formed of approximately forty turns of number 36 wire. The coil 48 is disposed within gap 20, between upper flux guide plate 12 and pole piece 16. Since gap 20 resides in the region of highest magnetic flux density, the coil 48 will have the strongest possible magnetic flux density within which to react and thus the highest possible force generating capability.

In order to power the punch assembly 8, voice coil 48 is provided with electrical leads 80 through which electrical voltages and current may be supplied to coil 48 to create the electromagnetic field necessary to cause displacement of coil 48, relative to upper flux guide 12.

In order to limit the rotation of bobbin 32 to prevent a twisting or torquing of spring 44 and the resultant binding of punch tube 78, an upper limit and anti-rotation stop 50 is provided. The upper limit and anti-rotation stop 50 may take the form of a headed shaft 54 mounted on or attached to the upper flux guide 12. The head 52 of the upper limit and the anti-rotation stop 50 will act to prevent the excessive upper movement of bobbin 32; meanwhile the shaft 54 of the stop 50, when engaged with a mating groove in the side of bobbin 32 will prevent bobbin 32 from rotating about the axis of punch 24.

In order to precisely position the lower or punching end of punch 24, a bushing plate 60 is provided. Bushing plate 60 is positioned with one of its planar faces engaged with the exposed face of the lower flux guide plate 14 and provided with a cylindrical hole 62. Cylindrical hole 62 is coaxial to the cylindrical hole 18 in the magnet plate 10. The cylindrical hole 62 receives a small extension 64 of the pole piece 16 to insure coaxiality. A guide bushing 66 is inserted within hole 62 to constrain punch 24 from any movement other than an axial movement.

In addition to guide bushing 66, a stripper bushing 68 is inserted into hole 62 of bushing plate 60. Stripper bushing 68 acts to hold the ceramic green sheet 70 while the punch 24 is being withdrawn to prevent movement or deformation of the green sheet 70. This prevents the friction between the interior of the via hole formed by punch 24 and punch 24 from pulling the ceramic green sheet 70, in its present easily deformable state, upward upon the withdrawal of punch 24 by spring 44.

Positioned below the stripper bushing 68 is a die bushing 72. Die bushing 72 will act to prevent excessive deflection and deformation in the ceramic green sheet 70 upon the piercing of the ceramic green sheet 70 by punch 24. The cooperative actions of stripper bushing 68 and die bushing 72 will provide the necessary restraining forces exerted over an area around the via hole formed by punch 24, thereby prevents the undesired deformation of the ceramic green sheet 70.

One of the punch assemblies 8, as illustrated in FIG. 1, is preferably disposed within each of the cylindrical holes 18, shown in FIG. 2. FIG. 2 is illustrative of a small matrix of punch station positions. It may be desirable to provide as many as 256 such punch stations in a matrix positioning, the punches at closely defined spatial relationships. It may also be desirable to vary the spacing between the punch stations if spacing requirements dictate that via holes be formed in ceramic green sheets 70 at non-uniformly spaced locations. The ceramic green sheet 70 may need to be displaced relative to the punching stations to properly position all possible via holes at the desired locations. Typically, the displacement of the green sheet 70 is accomplished by a step and repeat operation capable of movement in precisely defined increments in both the X and Y directions to access all possible via hole locations.

The operation of the magnetic plate punch actuator 8 is dependent upon electrical power being provided in a controlled manner over electrical leads 80 to voice coil 48. As the electrical leads 80 are energized from a power source, preferably under the control of a controller such as a computer, a magnetic field is formed surrounding coil 48. As coil 48 generates the magnetic field, it will react to the flux field concentrated by the upper flux guide 12 directing the magnetic field to the pole piece 16, in a region through which coil 48 passes. As the two magnetic fields interact and exert corresponding forces against the sources of their respective flux densities, being the only readily movable portion, the voice coil 48 will tend to be displaced downward coaxial with punch 24 to the position illustrated in FIG. 1. As the coil 48 is displaced downward, head 30 of punch 24 will be pulled downward by bobbin 32 and punch retainer 38. During this downward movement of bobbin 32, the upper limit anti-rotation stop 50 will prevent bobbin 32 from rotating about the axis of punch tube 78 and punch 24, while spring 44 will act to resist the downward movement of bobbin 32; in so doing, the spring 44 will store energy derived from the movement of bobbin 32. As bobbin 32 moves downward, the punch retainer 38 will engage the top of head 30 thereby driving punch 24 downward along with the bobbin 32 and punch tube 78. As the punch 24 extends downwardly, the tip 25 of punch 24 will pass through stripper bushing 68 and engage ceramic green sheet 70. Further displacement of punch 24 by the forces generated between coil 48 and upper flux guide 12 will cause the tip 25 of punch 24 to penetrate the ceramic green sheet 70 and protrude through the lower surface of ceramic green sheet 70, as illustrated in FIG. 1. Upon the completion of the displacement of bobbin 32 and resultant punching, the electrical current provided through leads 80 will be terminated by the controller, and the energy stored in spring 44 will pull upward on bobbin 32, displacing coil 48 upwardly through the upper flux guide 12/pole piece field 16 and, at the same time, retracts punch 24 by pulling on the lower surface of head 30. The current in coil 48 could be reversed to assist or speed the withdrawal of the punch 24 from green sheet 70. As the punch 24 is withdrawn from the ceramic green sheet 70, the ceramic green sheet 70 will tend to be pulled up against the lower surface of stripper bushing 68 by friction between punch 24 and green sheet 70. Stripper bushing 68 will hold the ceramic green sheet 70 and prevent green sheet 70 from being further deformed and displaced upward as the tip 25 of punch 24 is withdrawn. Upon the completion of the withdrawal of punch 24 from ceramic green sheet 70, the ceramic green sheet 70 may then be displaced in an X or Y direction for further punching operations or may be removed from the punch assembly 8 such that a new ceramic green sheet 70 may be inserted for punching.

As one will appreciate, the selection of the punches 24 may be accomplished by a computer selectively activating individual voice coils 48 on individual punch stations 8, and thereby allowing the enhanced flexibility of punching via holes at varying locations.

The significant advance disclosed herein of the structure results from the combination of magnetic plate 10 and the upper and lower flux guide plates 12 and 14, respectively. By utilizing a magnetic plate 10 as opposed to individual cylindrical magnets of the prior art, the magnetic material which may be close to an adjacent cylindrical hole 18 or in the region between four adjacent holes has an additive effect to the material which is close to the punch station being actuated, and thereby creates a stronger and more dense flux field in the gap 20. Even though situated in very close proximity to each other, individual magnets inherently will have air gaps between them and will not benefit from the close proximity to each other and, therefore, will not significantly enhance the flux density in gaps 20.

The use of the flux guide plates, likewise, will function to focus the magnetic flux density to the greatest density possible in gaps 20.

Further, by use of the magnetic plates 10 for the magnet 10, the upper flux guide 12 and lower flux guide 14, the punch actuator assembly 8 may be fabricated while eliminating the need for substantial mounting and positioning framework hardware. By eliminating the need for the additional mounting and positioning framework hardware, required by the prior punching mechanisms, the precision with which punch 24 may be located relative to the desired hole location in ceramic green sheet 70 may be enhanced. Enhancement of that positioning permits higher precision and the use of more tightly controlled stripper bushings 68 and punch bushings 72 which further results in less deformation and dimensional instability in the ceramic green sheet 70.

With the enhanced density of the magnetic flux field in gap 20, the size of the punch assembly 8 may be substantially reduced which creates several advantages. The most significant advantage of which is derived from the associated reduction in the size and mass of bobbin 32, which in turn permits a much faster acceleration and translation of punch 24 when coil 48 is energized. With the higher speed of punch 24, enhanced quality of punching results from minimal deformation of the green sheet 70.

Secondly, with the higher speed and lower mass of bobbin 32, the requirements for electrical power to coil 48 may be significantly reduced, resulting in less heat and correspondingly smaller cooling requirements.

With a small bobbin 32, and a punch retainer 38 of the type disclosed herein, individual punches 24 may be removed and replaced as needed without disassembling the entire punch assembly 8. Only a screwdriver need be used to loosen screw 40 and swing punch retainer 38 around screw 40 to permit the removal of punch 24 and head 30. A new punch 24 with head 30 then may be inserted, the retainer 38 repositioned, and screw 40 tightened. Accordingly, maintenance and repair may be greatly simplified by the use of the disclosed punch assembly 8.

It should be appreciated that minor changes and variations may be made in the manner in which the invention is implemented but that such minor variations should not remove the device from the scope of the following claims.

We claim:

1. A high velocity, precision punch for forming holes in ceramic green sheets, comprising:
   a magnetic plate comprising two parallel, planar surfaces;
   a pair of magnetically permeable plates having at least one planar surface and disposed in surface to surface relation to said magnetic plate;
   a plurality of cylindrical holes extending through said magnetic plate and said magnetically permeable plates;
   a plurality of magnetically permeable poles, each having an axis, disposed within said holes and each engaging a first one of said pair of said plates and forming an annular gap between said pole and a second one of said pair of plates, each of said poles comprising a central bore extending through said pole;
   a moveable bobbin disposed coaxial to said pole and displaceable axially to said pole, said bobbin supporting a coil of wire, said coil depending from said bobbin and disposed within said gap;
   said bobbin comprising a central bore coaxial to said axis of said pole;
   a punch, said punch extending through and from said bore of said bobbin;
   said bobbin further comprising a retaining means for retaining at least an end of said punch within said bobbin and preventing movement of said punch relative to said bobbin;
   a guide plate juxtaposed with said second one of said pair of plates and comprising a plurality of holes formed therein and disposed coaxial with said axis of said pole;
   at least a first bushing disposed within and coaxial with each said hole in said guide plate, said bushing surrounding said punch and disposed to present a substantially planar end surface for exposure to and engagement with said ceramic green sheet; and
   a second bushing comprising a substantially planar surface disposed spaced from and coaxial with said first bushing,
   whereby the impressing of an electrical current on said coil will create a magnetic field which will coact with a magnetic field concentrated by said second plate in said gap and pull said coil and said attached bobbin toward said pole, thereby rapidly displacing said punch thru said pole, said first bushing, said ceramic green sheet and said second bushing to form a hole in said green sheet.

2. The punch of claim 1 further comprising a spring attached to said bobbin and deformed by said bobbin when said coil is energized.

3. The punch of claim 1 further comprising a spring attached to said bobbin and extended by said bobbin when said coil is energized.

4. The punch of claim 1 wherein said bobbin further comprises a tube extending from said bobbin and disposed within said bore of said pole, and further surrounding said punch.

5. The punch of claim 1 wherein said punch comprises a head which is trapped by said bobbin and said retaining means, for movement with said bobbin.

6. The punch of claim 1 wherein said magnetic plate comprises a compressed and sintered particulate magnetic material.

7. The punch of claim 1 wherein said guide plate further comprises a third bushing having a central bore and disposed within each of said holes in said guide plate with said central bore coaxial with said pole, and guidingly circumscribing said punch.

* * * * *